(12) United States Patent
Lee

(10) Patent No.: US 7,947,130 B2
(45) Date of Patent: May 24, 2011

(54) TROIKA ACID SEMICONDUCTOR CLEANING COMPOSITIONS AND METHODS OF USE

(76) Inventor: Wai Mun Lee, Milpitas, CA (US)

( * ) Notice: Subject to any disclaimer, the term of this patent is extended or adjusted under 35 U.S.C. 154(b) by 0 days.

(21) Appl. No.: 12/889,665

(22) Filed: Sep. 24, 2010

(65) Prior Publication Data

US 2011/0094536 A1 Apr. 28, 2011

Related U.S. Application Data

(60) Provisional application No. 61/254,688, filed on Oct. 24, 2009.

(51) Int. Cl.
*C23G 1/02* (2006.01)
(52) U.S. Cl. .................. 134/3; 134/2; 134/25.4; 134/26; 134/28; 134/30; 134/34; 134/35; 134/36; 134/41; 134/42; 510/175; 510/436; 510/467; 510/469; 510/499
(58) Field of Classification Search .................. 134/2, 3, 134/25.4, 26, 28, 30, 34, 35, 36, 41, 42; 510/175, 510/436, 467, 469, 499
See application file for complete search history.

(56) References Cited

U.S. PATENT DOCUMENTS

| | | | |
|---|---|---|---|
| 5,314,512 A | 5/1994 | Sexton | |
| 5,858,317 A | 1/1999 | Lennon | |
| 5,859,278 A | 1/1999 | Lennon | |
| 5,859,290 A | 1/1999 | Lennon | |
| 5,861,525 A | 1/1999 | Lennon | |
| 5,905,163 A | 5/1999 | Lennon | |
| 5,935,542 A | 8/1999 | Lennon | |
| 5,945,082 A | 8/1999 | Lennon | |
| 5,948,931 A | 9/1999 | McKenna | |
| 6,143,705 A | 11/2000 | Kakizawa | |
| 6,218,563 B1 | 4/2001 | Lennon | |
| 6,310,019 B1 | 10/2001 | Kakizawa | |
| 6,395,693 B1 | 5/2002 | Wang | |
| 6,410,494 B2 | 6/2002 | Kakizawa | |
| 6,440,856 B1 | 8/2002 | Bessho | |
| 6,514,352 B2 | 2/2003 | Gotoh | |
| 6,514,921 B1 | 2/2003 | Kakizawa | |
| 6,534,458 B1 | 3/2003 | Kakizawa | |
| 6,541,434 B2 | 4/2003 | Wang | |
| 6,716,803 B2 | 4/2004 | Umekita | |
| 7,250,391 B2 | 7/2007 | Kanno | |
| 7,312,186 B2 | 12/2007 | Takashima | |
| 7,427,361 B2 | 9/2008 | Small | |
| 7,527,733 B2 | 5/2009 | McKenna | |
| 7,541,322 B2 | 6/2009 | Ikemoto | |
| 2006/0065604 A1* | 3/2006 | McKenna et al. ............. 210/688 |

FOREIGN PATENT DOCUMENTS

| | | |
|---|---|---|
| WO | 2009058272 | 9/2009 |
| WO | 2009058274 | 9/2009 |
| WO | 2009058275 | 9/2009 |
| WO | 2009058277 | 9/2009 |
| WO | 2009058278 | 9/2009 |
| WO | 2009058288 | 9/2009 |
| WO | 2009085072 | 9/2009 |

* cited by examiner

*Primary Examiner* — Sharidan Carrillo

(57) ABSTRACT

Semiconductor processing compositions for use with silicon wafers having an insulating layers and metallization layers on the wafers comprising water and one or more Troika acids which is also referred to as α,α-disubstituted trifunctional oximes or α-(Hydroxyimino) Phosphonoacetic acids, their salts, and their derivatives.

10 Claims, No Drawings

US 7,947,130 B2

TROIKA ACID SEMICONDUCTOR CLEANING COMPOSITIONS AND METHODS OF USE

CROSS-REFERENCE TO RELATED APPLICATIONS

The present application is a non-provisional application which claims priority from U.S. Provisional Appl. No. 61/254,688, filed Oct. 24, 2009, and is incorporated herein by reference in its entirety.

FIELD OF THE INVENTION

The present invention is a composition and method for use in semiconductor processes wherein the compositions comprise aqueous Troika acids, their derivatives and their salts which are useful in the manufacturing processes of integrated devices, such as, but not limited to, post etch residue removal, chemical mechanical planarization and post chemical mechanical planarization particles removal.

BACKGROUND OF THE INVENTION

A large number of complexing agents for metal ions are used in a wide variety of applications, such as: semiconductor cleaning, detergents and cleaners, electroplating, water treatment and polymerizations, the photographic industry, the textile industry, the papermaking industry, pharmaceuticals, cosmetics, foodstuffs and plant feeding.

Semiconductor processing applications increasingly rely on chemistries containing complexing agents. There are more than one hundred steps in a standard IC manufacturing process that involves wafer cleaning or surface preparation, including post-resist strip/ash residue removal, native oxide removal, and even selective etching. Although dry processes continue to evolve and offer unique advantages for some applications, most cleaning/surface prep processes are "wet," and have been found to benefit from the use of complexing agents in such wet compositions.

Moreover, such wet processes occasionally involve the use of chemicals that may present environmental challenges, such as hydrofluoric acid, hydrochloric acid, sulfuric acid, phosphoric acid or hydrogen peroxide. Due in part to environmental concerns, the use of more dilute chemistries has increased and has been aided by the use of some form of mechanical energy, such as megasonics or jet-spray processing. Accordingly, there is a need for chemistries that can be effectively used in diluted form.

Most formulations, being used in semiconductor applications, contain complexing agents or chelating agents. Metal chelating functionality is known in which a central metal ion is attached by coordination links to two or more nonmetal atoms (ligands) in the same molecule. Simple acidic organophosphorous chelating agents clean metals in aqueous solution essentially by a cation exchange reaction between the replaceable proton of the phosphonic acid OH group and the coordinating metal cation. Heterocyclic rings are formed as part of the coordination complex with the central (metal) atom as a member of each ring. When the complex becomes more soluble in the solution in which it is present, it functions as a cleaning process. If the metal complex is not soluble in the solution in which it is present, it becomes a passivating agent by forming an insoluble film on top of the metal surface.

Examples of complexing agents are nitrilotriacetic acid (NTA), ethylenediaminetetraacetic acid (EDTA), N,N'-bis(2-hydroxyphenyl) ethylenediiminodiacetic acid (HPED), triethylenetetranitrilohexaacetic acid (TTHA) desferriferrioxamin B,N,N',N"-tris[2-(N-hydroxycarbonyl)ethyl]-1,3,5-benzenetricarboxamide (BAMTPH), ethylenediaminediorthohydroxyphenylacetic acid (EDDHA), ethylenediaminetetramethylenephosphonic acid (EDTMP), α-(hydroxyimino)phosphonic acid, propylenediaminetetraacetic acid (PDTA), hydroxypropylenediaminetetraacetic acid (HPDTA), isoserinediacetic acid (ISDA), β-alaninediacetic acid (β-ADA), hydroxyethanediphosphonic acid, diethylenetriaminetetraacetic acid, diethylenetriaminetetramethylenephosphonic acid, hydroxyethyleneaminodiacetic acid, hydroxyethylethylenediaminetriacetic acid, diethylenetriaminepentaacetic acid, diethanolglycine, ethanolglycine, citric acid, glycolic acid, glyoxylic acid, acetic acid, lactic acid, phosphonic acid, glucoheptonic acid or tartaric acid, polyacrylates, carbonates, phosphonates, and gluconates, for example.

The complexing agents currently in commercial use, such as, glycolic acid, glyoxylic acid, lactic acid and phosphonic acid, are acidic in nature and have a tendency to attack the residue and remove both metals and metal oxides, such as, for example, copper and copper oxide. This undesired result presents a problem for formulators where a chelating function is sought only selectively to metal oxide residues and not to the metal itself, e.g., in an application involving metal, such as copper. Accordingly, there is a need for complexing agents that are not aggressive toward metal substrates, but still effectively chelate unwanted metal ion residues created during manufacturing processes.

U.S. Pat. Nos. 6,143,705, 6,310,019, 6,395,693, 6,410,494, 6,440,856, 6,514,352, 6,514,921, 6,534,458, 6,541,434, 6,716,803, 7,250,391, 7,312,186, and 7,541,322 discuss various compositions and methods of cleaning semiconductor substrates containing oximes, phosphonic acids, and organic acids. The compositions and methods of use are incorporated herein by reference in their entirety.

International Patent Application Nos. WO2009085072, WO2009058288, WO2009058278, WO2009058277, WO2009058275, WO2009058274, and WO2009058272 disclose a series of chelating agents with an amidoxime functional group. The cleaning compositions and methods of use are incorporated herein by reference in their entirety.

However, all these compositions require the use of, a combination of individual compounds with carboxylic functionality, amidoxime functionality and phosphonic functionality to achieve the desired cleaning performance as described in, for example, U.S. Pat. Nos. 6,395,693 and 6,541,434.

U.S. Pat. No. 7,427,361 describes the use of polymeric bounded chelator compounds, before being attached to the particle, and possesses at least three functional groups selected from the group consisting of hydroxyls, carboxylic acids, amines, amides, imines, imides, mercaptans, sulfonic acids, hydroxamic acids, carbonyl groups, esters, ethers, ureas, cyano groups, nitro groups, carbonates, inorganic salts thereof, and a combination thereof in a polishing slurry system. The polymeric system includes poly(styrene sulfonic acid), poly(vinyl sulfonic acid), poly(acrylic acid), poly(methacrylic acid), a poly(acrylate), a poly(methacrylate), a poly(alkacrylate), poly(maleic acid), poly(vinyl acetate), poly(vinyl alcohol), poly(acrylamide), poly(cyanoacrylate), a cellulosic material, and a combination or copolymer thereof. However, the different moieties are each separately attached to the polymer instead of being self-contained in the same molecule. Furthermore, the '361 patent does not include phosphonic and oxime moieties, which each provide unique synergistic effects with the carboxylic moiety. Moreso, the '361 patent fails to specify an arrangement of functional groups or the importance of arranging the moieties in a particular way attached to the polymer.

U.S. Pat. Nos. 7,527,733, 6,218,563, 5,948,931, 5,945,082, 5,935,542, 5,905,163, 5,861,525, 5,859,290, 5,859,278, and 5,858,317 describe the preparation of α-(Hydroxyimino) Phosphonoacetic acids and its chelating properties. U.S. Published Application No. 20060065604 describes the preparation of attaching α-(Hydroxyimino) Phosphonoacetic acids moiety to a macroporous polymeric system.

Troika acid is α-(hydroxyimino)phosphonoacetic acid or α,α-disubstituted trifunctional oximes which has a phosphonate, oxime and carboxylate moieties anchored to a common carbon atom in a single molecule. Due to the unique isomeric location of the oxime hydroxyl group, this group can interact via hydrogen-bonding with either of its two neighboring groups, depending on its orientation.

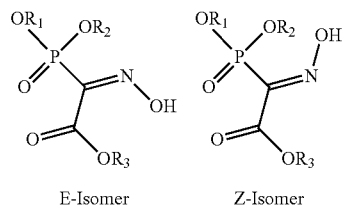

E-Isomer    Z-Isomer

Troika acids have unique properties not found in other chelating agents used in the art. For example, the mode of chelation for the Troika acids is different from common chelating agents such as ethylenediaminetetraacetic acid (EDTA). Specifically, a ligand such as EDTA coordinates a metal ion directly through an amine nitrogen atom, whereas a Troika acid coordinates through an oxime nitrogen atom.

Additionally, by virtue of its unique central location in the Troika acid structure, the oxime OH group can hydrogen-bond with either of its two neighboring groups, giving rise to two isomeric configurations. The two isomers are based on the orientation of the N—OH in space. Each of the two isomers has different properties. Thus, the oxime hydroxyl group significantly influences, if not directs, the chemical reactivity of either of its two neighboring groups, depending upon its position.

Troika acids and their derivatives act as chelates by forming coordinate bonds between a pair of Troika acid heteroatoms and a metal cation. This means Troika acids can chelate to a metal cation through an oxygen on the phosphonate (acid or ester) group or a carboxylic acid oxygen atom and the oxime nitrogen atom depending on its isomeric position. In both of these modes, the configuration that comprises the metal cation, the two chelating atoms and the Troika acid backbone between them, is a 5-membered ring, which is a particularly stable arrangement. Which of the two chelating modes is favored may be altered by the pH and an appropriate derivatization of the Troika acid.

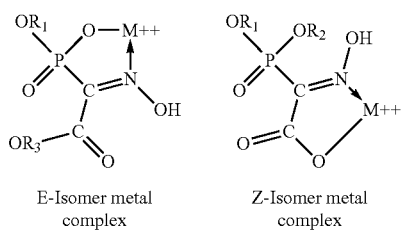

E-Isomer metal complex    Z-Isomer metal complex

In general, however, a Troika acid preferentially chelates a metal ion through the phosphonate and oxime group, i.e. E-Isomeric configuration.

In juxtaposition, cleaning needs and goals have become more demanding. Increasingly, wafers are being processed with a single-wafer approach, as compared to a batch immersion or batch spray system. The single-wafer approach requires fast and effective chemical cleaning. Further, in wafer cleaning applications, particle removal may not be the main objective. Other goals become the focus, such as removing native oxide or photoresist residue after strip/ash. Accordingly, there is a need for chemistries that can be used in both single-wafer and batch processing, while addressing a variety of goals in the removal process.

The compositions and methods encompassed and exemplified herein address these problems.

The discussion of the background to the invention herein is included to explain the context of the invention, parts of which are intended to support the claims herein. Statements in the background are not admissions, including that any of the material referred to was published, known, or part of the common general knowledge at the priority date of any of the claims.

In addition, throughout the description and claims of the specification, use of the word "comprise" and variations thereof, such as "comprising" and "comprises", is not intended to exclude other additives, components, or steps.

SUMMARY OF THE INVENTION

A semiconductor processing composition comprises an aqueous solution of at least one Troika acid, its derivatives or its salts.

The Trioka acid, its derivatives, or its salts comprise the general formula:

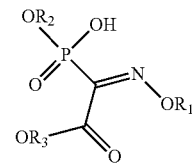

or tautomers thereof, wherein $R_1$ is hydrogen, hydrogen, alkyl, heteroalkyl, aryl, heteroaryl; $R_2$ and $R_3$ is selected independently from the group consisting of hydrogen, alkyl, heteroalkyl, aryl, heteroaryl, sodium, and ally or aryl ammonium. The Troika acid may be present in an amount of about 0.001 to about 35 percent by weight.

The alkyl or aryl group may be selected from the preferred group consisting of methyl, ethyl, propyl, butyl, benzyl, phenyl, p-nitrophenyl, and o-nitrobenzyl, although the alkyl or aryl group may be any suitable alkyl or aryl group.

The alkyl ammonium group may be selected from the preferred group consisting of anilinium, dicyclohexylammonium, tetramethylammonium, benzyltetramethylammonium, 2-hydroxyethyl trimethlyammonium, and tris(2-hydroxyethyl) methylammonium, although the alkyl ammonium group may be any suitable alkyl ammonium group.

The Troika acid, its derivatives or its salts may be a dendrimer comprising two or more Troika acids, derivatives or salts.

The compositions may also include solvents, acids, bases, surfactants, compounds with oxidation and reduction potentials, activators and fluorides, based on the application or desired result.

One method of using the compositions encompassed herein is to clean semiconductor substrates. An example of such a use may include the steps of: providing a substrate having a surface comprising copper-containing conductor and a low-k dielectric material and one or more of resist, etching residue, planarization residue, and copper oxide disposed on the surface thereof; contacting the surface of the substrate with an effective amount of solution comprising an aqueous solution of at least one Troika acid, its derivatives, salts, or tautomers thereof consistent with the compositions disclosed herein; wherein the wafer is exposed to the solution for a sufficient time and temperature to effectively remove surface residue and contaminants created during a semiconductor manufacturing process. The exposure time may be, for example, between about 10 seconds and about 30 minutes and the temperature may be, for example, from ambient up to 50° C.

Another use would be to apply the aqueous Troika acid compositions herein to a semiconductor substrate during a stripping process and post etch residue cleaning process. A further use would be to apply the aqueous Troika acid compositions herein to a substrate during a cleaning process, followed by a chemical mechanical planarization step during the semiconductor fabrication process. Alternately, the aqueous Troika acid composition could be used in both the cleaning process and during the chemical mechanical planarization step or during only the chemical mechanical planarization step with or without a suitable abrasive.

The abrasive particles can be of any suitable material. For example, the abrasive particles can comprise a metal oxide, such as a metal oxide selected from the group consisting of alumina, silica, titania, ceria, zirconia, germania, magnesia, co-formed products thereof, and combinations thereof, or a silicon carbide, boron nitride, diamond, garnet, or ceramic abrasive material. The abrasive particles can be hybrids of metal oxides and ceramics or hybrids of inorganic and organic materials. The particles also can be polymer particles, many of which are described in U.S. Pat. No. 5,314,512, such as polystyrene particles, polymethylmethacrylate particles, liquid crystalline polymers (LCP, e.g., aromatic copolyesters containing naphthalene units), polyetheretherketones (PEEK's), particulate thermoplastic polymers (e.g., particulate thermoplastic polyurethane), particulate cross-linked polymers (e.g., particulate cross-linked polyurethane or polyepoxide), or a combination thereof. The composite particles can be any suitable particle containing a core and an outer coating. For example, the composite particles can contain a solid core (e.g., a metal oxide, metal, ceramic, or polymer) and a polymeric shell (e.g., polyurethane, nylon, or polyethylene). The clarifying particles can be phyllosilicates, (e.g., micas such as fluorinated micas, and clays such, as talc, kaolinite, montmorillonite, hectorite), glass fibers, glass beads, diamond particles, carbon fibers, and the like.

Substrate, as used in chemical mechanical polishing or planarization, refers to the physical object that is to be polished by means of the chemical mechanical process. A substrate may also be referred to as a wafer. The substrate may be made of semiconducting, non-semiconducting, or combinations of semiconducting and non-semiconducting materials. Silicon wafers may have thin films of various materials formed upon them. These thin films may be polished with CMP processes. Other substrate materials such as GaAs, silicon-on-sapphire, or silicon on insulator (SOI) may be polished with CMP processes.

In one embodiment, the chemical mechanical polishing slurry may comprise an oxidizer, a diluents, optionally, an abrasive material, and a Troika Acid moiety attached to a polymeric resin. The polymeric resin is microporous, or mesoporous, or macroporous material or a combination thereof. Porous materials are classified into several kinds by size. According to IUPAC notation, microporous materials have pore diameters of less than 2 nm, mesoporous material have pore diameters between about 2 nm and about 50 nm, and macroporous materials have pore diameters of greater than 50 nm. The resin preferably be selected from the group consisting of: PS-DVB, Chelex, polyamine, amine-modified styrene-divinylbenzene, aminated phenol-formaldehyde resin, and amine-modified acrylic resin, for example. Other suitable resins may be used in the polymeric system, such as derivatives of the preferred resins listed above.

In some applications, the compositions herein may further include one or more organic solvent in an amount of up to about 99 percent by weight, one or more acids in an amount of about 0.001 to about 45 percent by weight, one or more bases in an amount of about 0.001 to about 45 percent by weight, one or more activators in an amount of about 0.001 to about 25 percent by weight, one or more compounds with oxidation and reduction potentials in an amount of about 0.001 to about 25 percent by weight, one or more additional chelating or complexing agents in an amount up to about 15 percent by weight.

Where one or more surfactants are used, the composition may further comprises a surfactant in an amount of about 10 ppm to about 5 percent by weight.

In some uses it may be preferable to dilute the Troika acid compositions prior to use with water.

DETAILED DESCRIPTION

In the Summary of the Invention above, and in the Detailed Description of the Invention, the Examples, and the claims below, reference is made to particular features of the invention. It is to be understood that the disclosure of the invention in this specification includes all appropriate combinations of such particular features. For example, where a particular feature is disclosed in the context of a particular embodiment or a particular claim, that feature can also be used, to the extent appropriate, in the context of other particular embodiments and claims, and in the invention generally.

The descriptions herein describe exemplary compositions and uses of aqueous compositions comprising one or more Troika acid compounds, their derivatives, or their salts, containing one or more Troika acid functional groups in semiconductor applications, wherein the Troika acid compound complexes with metal (or metal oxide) on a surface, in a residue, or both to achieve cleaning and protection of the said surface.

In one embodiment, Troika acid is α-(hydroxyimino) phosphonoacetic acid or α,α-disubstituted trifunctional oximes has the following structures:

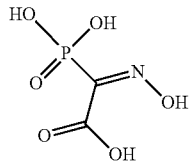

or tautomers thereof.

In one embodiment, the Troika acid compound comprises the general formula

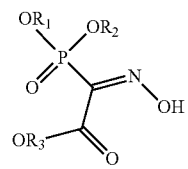

or tautomers thereof.
wherein $R_1$, and $R_2$ are selected independently from the group consisting of hydrogen, alkyl, heteroalkyl, aryl, heteroaryl, and alkyl or aryl ammonium; and R3 is selected independently from the group of hydrogen, alkyl, heteroalkyl, aryl, heteroaryl, substituted aromatics and alkyl or aryl ammonium.

The alkyl or aryl group is selected from the group consisting of methyl, ethyl, propyl, butyl, benzyl, phenyl and the like.

The substituted aromatics are selected from the group consisting of p-nitrophenyl, o-nitrobenzyl and the like.

The alkyl and aryl ammonium is selected from the group of quaternary ammonium hydroxide, such as dicyclohexylammonium hydroxide, tetramethylammonium hydroxide, benzyltetramethylammonium hydroxide, 2-hydroxyethyl trimethylammonium hydroxide, and Tris(2hydroxyethyl) methylammonium hydroxide and the like.

One embodiment of the present invention relates to a dendrimer or polymer of the Troika acid, or its derivative or its salt comprising two or more Troika acid by a linking the ester position of the carboxylic acid moiety or mono-ester position of the phosphonate moiety or hydroxyl group of the oxime moiety or in combination thereof.

One embodiment of the present invention relates to Troika acid moiety attached to a polymer, such as polymeric slurry particles, as described in U.S. Pat. Nos. 5,314,512, 7,427,361, such as polystyrene particles, polymethylmethacrylate particles, liquid crystalline polymers (LCP, e.g., aromatic copolyesters containing naphthalene units), polyetheretherketones (PEEK's), particulate thermoplastic polymers (e.g., particulate thermoplastic polyurethane), particulate cross-linked polymers (e.g., particulate cross-linked polyurethane or polyepoxide), or a combination thereof. The composition and method of use are incorporated herein by reference in their entirety.

Examples of a dendrimer of Troika acids has the general formula.

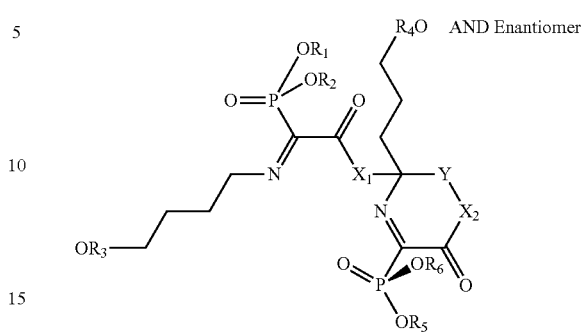

wherein N~OH denotes a bond between nitrogen and oxygen of the OH which represents the Z or E iomseric form;
wherein $R_1$, $R_2$, $R_3$, $R_4$, $R_5$, and $R_6$ are selected from the group consisting of hydrogen, alkyl, aryl, substituted alkyl, and substituted aryl; at least one of $R_1$ and $R_2$ is not hydrogen; at least one of $R_5$, and $R_6$ is not hydrogen; $X_1$ and $X_2$ are each independently selected from the group consisting of O, $NR_7$, and S, wherein $R_7$ is hydrogen, alkyl, aryl, substituted alkyl, or substituted aryl; and Y is a linking group selected from the group consisting of alkylene, substituted alkylene, alkylidene, substituted alkylidene, arylene, or substituted arylene. Y additionally comprises a substituent that binds to the resin. The resin may be selected from the group consisting of PS-DVB, Chelex, polyamine, amine-modified styrene-divinylbenzene, aminated phenol-formaldehyde resin, amine-modified acrylic resin, and the like.

Another embodiment herein includes, as one or more of the Troika acid compounds, one or more compounds whose structure comprises:

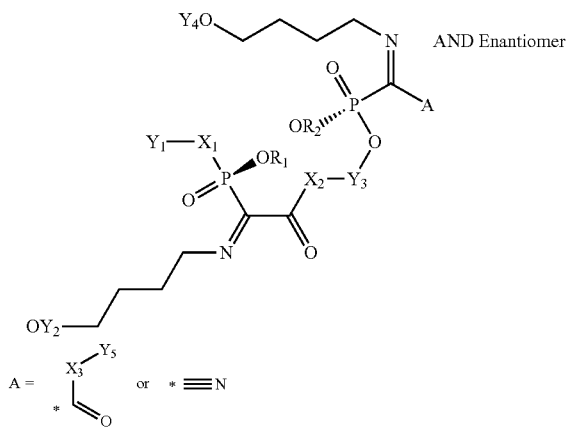

wherein N~OH denotes a bond between nitrogen and oxygen of the OH which represents the Z or E iomseric form;
wherein: $X_1$, $X_2$ and $X_3$ are independently selected from the group consisting of: O, $NR_3$, and S; $R_1$, $R_2$, $Y_1$, $Y_2$, $Y_3$, $Y_4$, and $Y_5$, are independently selected from the group consisting of hydrogen, alkyl, aryl, substituted alkyl, and substituted aryl; one of $Y_1$, $Y_2$, and $Y_3$ is selected from the group consisting of: alkylene, oxy-alkylene, amino-alkylene, thio-alkylene, —(CH2)nC(=O)NH—, —(CH2)nC(=O)O—, arylene, substituted arylene, heteroarylene, and substituted heteroarylene; at least one of $R_1$ and $Y_1$ is not hydrogen; and at least one of $R_1$, $R_2$, $Y_1$, $Y_2$, $Y_4$, and $Y_5$ is hydrogen; and at least one of $R_1$ and $Y_1$ is not hydrogen.

wherein the resin is attached to the compound through one of $Y_1, Y_2, Y_4$ or $Y_5$ The resin may be selected from the group consisting of PS-DVB, Chelex, polyamine, amine modified styrene-divinylbenzene, aminated phenol-formaldehyde resin, amine-modified acrylic resin, and the like.

Another embodiment herein includes, as one or more of the Troika acid compounds, one or more compounds whose structure comprises:

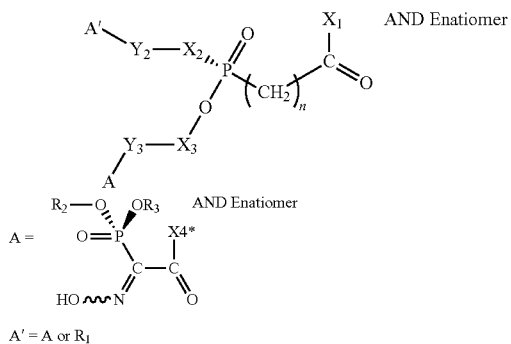

wherein: a starred atom denotes a point of attachment; N.~.O denotes a bond that represents the Z or E isomeric form; $N_1$, $X_2$, $X_3$ and $X_4$ are independently selected from the group consisting of: O, $NR_4$, and S; $X_1$ is attached directly to the resin; $Y_2$ and $Y_3$ are independently selected from the group consisting of: alkylene, oxy-alkylene, aminoalkylene, thioalkylene, arylene, substituted arylene, hetereoarylene, and substituted heteroarylene; $R_1$, $R_2$, $R_3$, and $R_4$ are independently selected from the group consisting of: hydrogen, alkyl, aryl, substituted alkyl, and substituted aryl; and n is from 1 to 5. The methylene group can further derivatized to form a hydroxyl-imino group when n=1 to, provide a methylene group.
wherein n=1 to provide a methylene group, and the methylene group is derivatized to form a hydroxy-imino group. wherein n=1 to provide a methylene group, and the methylene group is derivatized to form a hydroxy-imino group.

Troika acids described herein are stable compounds with no known toxicity. Therefore such compounds are suitable in applications where environmental concerns exist and offer a green technology advantage without sacrificing efficacy.

One embodiment of the present invention involves the use of an aqueous composition comprising Troika acid, its derivatives, or salts salt in a semiconductor application wherein the Troika acids compound complexes with metal (or metal oxide) on a surface, in a residue, or both.

One embodiment of the present invention involves the use of an aqueous composition comprising a Troika acids dendrimer (i.e., a compound containing one or more Troika acids functional groups) in a semiconductor application wherein the Troika acid dendrimer compound complexes with metal (or a metal oxide) on a surface, in a residue, or both.

The compositions of the invention may contain sufficient amount of one or more Troika acids compound which allows the composition effectively remove surface residue and contaminants created during semiconductor manufacturing process.

Within the scope of this invention, water may be introduced into the composition essentially only in chemically and/or physically bound form or as a constituent of the raw materials or compounds.

The composition further comprises chemicals from one or more groups selecting from the following:

Solvent, from about 1 to about 99 Percent by Weight.

The compositions of the present invention also include 0% to about 99% by weight and more typically about 1% to about 80% by weight of a water miscible organic solvent where the solvent(s) is/are preferably chosen from the group of water miscible organic solvents. Examples of water miscible organic solvents include, but are not limited to, dimethylacetamide (DMAC), N-methyl pyrrolidinone (NMP), N-Ethyl pyrrolidone (NEP), N-Hydroxyethyl Pyrrolidone (HEP), N-Cyclohexyl Pyrrolidone (CHP) dimethylsulfoxide (DMSO), Sulfolane, dimethylfonnamide (DMF), N-methylfonnamide (NMF), fonnamide, Monoethanol amine (MEA), Diglycolamine, dimethyl-2-piperidone (DMPD), morpholine, N-morpholine-N-Oxide (NMNO), imidazolidinones such as 1,3-dimethyl-2-imidazolidinone, 1,3-diethyl-2-imidazolidinone, or 1,3-diisopropyl-2imidazolidinone; lactones such as gamma-butyrolactone or deltavalerolactone; tetrahydrofurfuryl alcohol, cyclohexanol, cyclohexanone, polyethylene glycols and polypropylene glycols, glycerol, glycerol carbonate, triacetin, ethylene glycol, propylene glycol, propylene carbonate, hexylene glycol, ethanol and n-propanol and/or isopropanol, diglycol, propyl or butyl diglycol, hexylene glycol, ethylene glycol methyl ether, ethylene glycol ethyl ether, ethylene glycol propyl ether, ethylene glycol mono-nbutyl ether, diethylene glycol methyl ether, diethylene glycol ethyl ether, propylene glycol methyl, ethyl or propyl ether, dipropylene glycol methyl or ethyl ether, methoxy, ethoxy or butoxy triglycol, I-butoxyethoxy-2-propanol, 3-methyl-3-methoxybutanol, propylene glycol t-butyl ether, and other amides, alcohols or pyrrolidones, ketones, sulfoxides, or multifunctional compounds, such as hydroxyamides or aminoalcohols, and mixtures of these solvents thereof. The preferred solvents, when employed, are dimethyl acetamide and dimethyl-2-piperidone, dimethylsufoxide and N-methylpyrrolidinone, diglycolamine, and monoethanolamine.

Acids—from about 0.001% to 45% by Weight.

Possible acids are either inorganic acids or organic acids provided these are compatible with the other ingredients Inorganic acids include hydrochloric acid, hydrofluoric acid, sulfuric acid, phosphoric acid, phosphorous acid, hypophosphorous acid, phosphonic acid, nitric acid, and the like Organic acids include monomeric and/or polymeric organic acids from the groups of unbranched saturated or unsaturated monocarboxylic acids, of branched saturated or unsaturated monocarboxylic acids, of saturated and unsaturated dicarboxylic acids, of aromatic mono-, di- and tricarboxylic acids, of sugar acids, of hydroxy acids, of oxo acids, of amino acids and/or of polymeric carboxylic acids are preferred.

From the group of unbranched saturated or unsaturated monocarboxylicacids: methanoic acid (formic acid), ethanoic acid (acetic acid), propanoic acid (propionic acid), pentanoic acid (valeric acid), hexanoic acid (caproic acid), heptanoic acid (enanthic acid), octanoic acid (caprylic acid), nonanoic acid (pelargonic acid), decanoic acid (capric acid), undecanoic acid, dodecanoic acid (lauric acid), tridecanoic acid, tetradecanoic acid (myristic acid), pentadecanoic acid, hexadecanoic acid (palmitic acid), heptadecanoic acid (margaric acid), octadecanoic acid (stearic acid), eicosanoic acid (arachidic acid), docosanoic acid (behenic acid), tetracosanoic acid (lignoceric acid), hexacosanoic acid (cerotic acid), triacontanoic acid (melissic acid), palmitoleic acid, petroselic acid, petroselaidic acid, oleic acid, elaidic acid, linoleic acid, linolaidic acid and linolenic acid.

From the group of branched saturated or unsaturated monocarboxylic acids: 2-methylpentanoic acid, 2-ethylhexanoic acid, 2-propylheptanoic acid, 2-butyloctanoic acid, 2-pentylnonanoic acid, 2-hexyldecanoic acid, 2-heptylundecanoic acid, 2-octyldodecanoic acid, 2-nonyltridecanoic acid, 2-decyltetradecanoic acid, 2undecylpentadecanoic acid, 2-dodecylhexadecanoic acid, 2-tridecylheptadecanoic acid, 2tetradecyloctadecanoic acid, 2-pentadecylnonadecanoic acid, 2-hexadecyleicosanoic acid, 2-heptadecylheneicosanoic acid. From the group of unbranched saturated or unsaturated di- or tricarboxylic acids: propanedioic acid (malonic acid), butanedioic acid (succinic acid), pentanedioic acid (glutaric acid), hexanedioic acid (adipic acid), heptanedioic acid (pimelic acid), octanedioic acid (suberic acid), nonanedioic acid (azelaic acid), decanedioic acid (sebacic acid), 2c-butenedioic acid (maleic acid), 2t-butenedioic acid (fumaric acid), 2-butynedicarboxylic acid (acetylenedicarboxylic acid). From the group of aromatic mono-, di- and tricarboxylic acids: benzoic acid, 2carboxybenzoic acid (phthalic acid), 3-carboxybenzoic acid (isophthalic acid), 4carboxybenzoic acid (terephthalic acid), 3,4"-dicarboxybenzoic acid (triinellitic acid), and 3,5-dicarboxybenzoic acid (trimesionic acid).

From the group of sugar acids: galactonic acid, mannonic acid, fructonic acid, arabinonic acid, xylonic acid, ribonic acid, 2-deoxyribonic acid, alginic acid. From the group of hydroxy acids: hydroxyphenylacetic acid (mandelic acid), 2hydroxypropionic acid (lactic acid), hydroxysuccinic acid (malic acid), 2,3dihydroxybutanedioic acid (tartaric acid), 2-hydroxy-1,2,3-propanetricarboxylic acid (citric acid), ascorbic acid, 2-hydroxybenzoic acid (salicylic acid), and 3,4,5trihydroxybenzoic acid (gallic acid).

From the group of oxo acids: 2-oxopropionic acid (pyruvic acid) and 4-oxopentanoic acid (levulinic acid).

From the group of amino acids: alanine, valine, leucine, isoleucine, proline, tryptophan, phenylalanine, methionine, glycine, serine, tyrosine, threonine, cysteine, asparagine, glutamine, aspartic acid, glutamic acid, lysine, arginine, and histidine.

From the group consisting of methanesulfonic acid, xylenesulfonic acid, toluenesulfonic acid, dodecylbenzenesulfonic acid, trifluoracetic acid, and mixtures thereof Bases—from about 0.001% to 45% by Weight.

Possible bases are either inorganic bases or organic bases provided these are compatible with the other ingredients. Inorganic bases include sodium hydroxide, lithium In one embodiment, the alkanolamines are primary, secondary or tertiary amines. In an exemplary embodiment, the alkanolamines are monoamines, diamines or triamines. The alkanol group of the amines preferably has from 1 to 5 carbon atoms. Examples of suitable alkanolamines include, but are not limited to, mono-ethanolamine (MEA), diethanolamine, triethanolamine, tertiary-butyldiethanolamine isopropanolamine, 2-amino-1-propanol, 3amino-I-propanol, isobutanolamine, 2-amino-2-ethoxyethanol, and 2-amino-2-ethoxy propanol. Quaternary alkylammonium hydroxide which may include, but are not limited to, tetramethylammonium hydroxide (TMAH), TMAH pentahydrate, benzyltetramethylammonium hydroxide (BTMAH), Tetrabutylammonium hydroxide (TBAH), 2-hydroxyethyl trimethylammonium hydroxide (choline), and Tris(2-hydroxyethyl) methylammonium hydroxide (THEMAH).

Activator—from about 0.001% to 25% by Weight.

According to the present invention, the cleaning compositions comprise one or more substances from the group of activators, in particular from the groups of polyacylated alkylenediamines, in particular tetraacetylethylenediamine (TAED), Nacylimides, in particular N-nonanoylsuccinimide (NaSI), acylated phenolsulfonates, in particular n-nonanoyl- or isononanoyloxybenzenesulfonate (n- or iso-NaBS) and nmethylmorpholiniumacetonitrile, methylsulfate (MMA), and "nitrile quaternary" compound in amounts of from 0.1 to 20% by weight, preferably from 0.5 to 15% by weight and in particular from 1 to 10% by weight, in each case based on the total composition to enhance the oxidation/reduction performance of the cleaning solutions. The "nitrile quats", cationic nitrites has the formula,

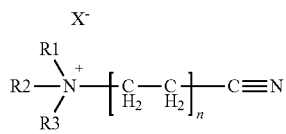

in which R1 is —H, —CH$_3$, a C2-24-alkyl or -alkenyl radical, a substituted C2-24-alkyl or -alkenyl radical with at least one substituent from the group —Cl, —Br, —OH, —NH$_2$, —CN, an alkyl- or alkenylaryl radical with a C1-24-alkyl group, or is a substituted alkyl- or alkenylaryl radical with a C1-24-alkyl group and at least one further substituent on the aromatic ring, R2 and R3, independently of one another, are chosen from CH$_2$—CN, —CH$_3$, —CH$_2$—CH$_3$, —CH$_2$—CH$_3$, —CH(CH$_3$)—CH$_3$, —CH$_2$—OH, —CH$_2$—CH$_2$—OH, —CH(OH)—CH$_3$, —CH$_2$—CH$_2$—CH$_2$—OH, —CH$_2$—CH(OH)—CH$_3$, —CH(OH)—CH$_2$—CH$_3$, —CH$_2$CH$_2$O)$_n$H where n=1, 2, 3, 4, 5 or 6 and X is an anion.

Compounds Having Oxidation and Reduction Potential—from about 0.001% to 25% by Weight.

These compounds include hydroxylamine and its salts, such as hydroxylamine chloride, hydroxylamine nitrate, hydroxylamine sulfate, hydroxylamine phosphate or its derivatives, such as N,N-diethylhydroxylamine, N-Phenylhydroxylamine Hydrazine and its derivatives; hydrogen peroxide; persulfate salts of ammonium, potassium arid sodium, permanganate salt of potassium, sodium; and other sources of peroxide are selected from the group consisting of: perborate monohydrate, perborate tetrahydrate, percarbonate, salts thereof, and combinations thereof. For environmental reasons, hydroxylamine phosphate is not preferred.

Other compounds which may be used as ingredients within the scope of the present invention, are the diacyl peroxides, such as, for example, dibenzoyl peroxide.

Further typical organic compounds which have oxidation/reduction potentials are the peroxy acids, particular examples being the alkyl peroxy acids and the aryl peroxy acids. Preferred representatives are (a) peroxybenzoic acid and its ring substituted derivatives, such as alkylperoxybenzoic acids, but also peroxy-a-naphthoic acid and magnesium monoperphthalate, (b) the aliphatic or substituted aliphatic peroxy acids, such as peroxylauric acid, peroxystearic acid, c-phthalimidoperoxycaproic acid [phthaloiminoperoxyhexanoic acid (PAP)], o-carboxybenzamidoperoxycaproic acid, Nnonenylamidoperadipic acid and N-nonenylamidopersuccinate, and (c) aliphatic and araliphatic peroxydicarboxylic acids, such as 1;2-diperoxycarboxylic acid, 1,9diperoxyazelaic acid, diperoxysebacic acid, diperoxybrassylic acid, the diperoxyphthalic acids, 2-decyldiperoxybutane-1,4-dioic acid. N,N-terephthaloyldi(6-aminopercaproic acid) may be used.

Other Chelating Agents and Corrosion Inhibitors.

Preferably, the cleaning composition comprises (by weight of the composition) from 0.0% to 15% of additional one or more chelant. A further possible group of ingredients are the chelate complexing agents. Chelate complexing agents are substances which form cyclic compounds with metal ions, where a single ligand occupies more than one coordination site on a central atom, i.e. is at least "bidentate". In this case, stretched compounds are thus normally closed by complex formation via an ion to give rings. The number of bonded ligands depends on the coordination number of the central.ion. Complexing groups (ligands) of customary complex forming polymers are iminodiacetic acid, hydroxyquinoline, thiourea, guanidine, dithiocarbamate, hydroxamic acid, α-(Hydroxyimino) Phosphonoacetic acids, aminophosphoric acid, (cycl.) polyamine, mercapto, 1,3dicarbonyl and crown ether radicals, some of which have very specific activities toward ions of different metals For the purposes of the present invention, it is possible to use complexing agents of the prior art. These may belong to different chemical groups. Preferred chelating/complexing agents include the following, individually or in a mixture with one another. Polycarboxylic acids in which the sum of the carboxyl and optionally hydroxyl groups is at least 5, such as gluconic acid, nitrogen-containing mono- or polycarboxylic acids, such as ethylenediaminetetraacetic acid (EDTA), N-hydroxyethylethylenediaminetriacetic acid, diethylenetriaminepentaacetic acid, hydroxyethyliminodiacetic acid, nitridodiacetic acid3-propionic acid, isoserinediacetic acid, N,N-di(.~.-hydroxyethyl)glycine, N-(1,2dicarboxy-2-hydroxyethyl)glycine, N-(1,2-dicarboxy-2-hydroxyethyl)-aspartic acid ornitrilotriacetic acid (NTA), geminal diphosphonic acids, such as 1-hydroxyethane-1,1diphosphonic acid (HEDP), higher homologs thereof having up to 8 carbon atoms, and hydroxy or amino group-containing derivatives thereof and 1-aminoethane-1, 1diphosphonic acid, higher homologs thereof having up to 8 carbon atoms, and hydroxy or amino group-containing derivatives thereof, aminophosphonic acids, such as ethylenediaminetetra(methylenephosphonic acid), diethylenetriaminepenta (methylenephosphonic acid) or nitrilotri(methylenephosphonic acid), phosphonopolycarboxylic acids, such as 2-phosphonobutane-1,2,4-tricarboxylic acid, and cyclodextrins.

Surfactants—from about 10 ppm to 5%.

The compositions, according to the invention may thus also comprise nonionic, anionic, cationic, and/or amphoteric surfactants as surfactant component.

Source of Fluoride Ions—from an Amount about 0.001% to 10%.

Sources of fluoride ions include, but are not limited to, ammonium bifluoride, ammonium fluoride, hydrofluoric acid, sodium hexafluorosilicate, fluorosilicic acid and tetrafluoroboric acid.

The compositions of the invention contemplate various combinations of the above optional components.

For example, the composition can comprise or consist essentially of at least one Troika acid compound and water. In another exemplary aspect, the composition can comprise at least Troika acid compound, water and one or more organic solvents miscible in water. In another exemplary aspect, the composition can comprise at least one Troika acid compound, water and one or more acid compounds. In another exemplary aspect, the composition can comprise at least one Troika acids compound, water, and one or more basic compounds. In another example, the composition can comprise at least one Troika acid compound, water, one or more organic solvents miscible in water and one or more acidic compounds. In another example, the composition can comprise at least one Troika acid compound, water, and one or more fluoride-containing compounds which are substantially free from metal ions. In another example, the composition can comprise at least one Troika acid compound, water, one or more chelating agent and/or a corrosion inhibitor. In another example, the composition can comprise at least one Troika acid compound, water, one or more organic solvents miscible with water and one or more fluoride-containing compounds which are substantially free from metal ions.

The Troika acid compounds may be used in semiconductor manufacturing processes; including, but not limited to, as a complexing agent for removal of residues from semiconductor substrates and in CMP slurries.

One exemplary embodiment of the invention is a method of applying a composition containing at least water and a Troika acids compound to a semiconductor substrate, comprising contacting the substrate with the composition.

The composition may be applied to the semiconductor substrate as part of a CMP process, during a cleaning process and during a stripping process. Optionally, the pH is maintained to cause a passivating layer to form on the semiconductor substrate surface.

Another exemplary embodiment of the present invention is a method of processing a wafer comprising: placing a wafer in a single wafer or batch cleaning tool and exposing the wafer to an aqueous cleaning solution comprising at least one Troika acid compound, wherein the wafer is exposed to the solution for an appropriate time, such as in the approximate range of 30 seconds to 90 seconds.

The cleaning solution comprising at least one Troika acid compound may be further diluted prior to use (e.g. by a factor of from about 10 to about 500).

Without being bound to any particular theory, it is understood that the multidentate complexing agents described above complex with substrate surfaces to remove contaminants on such surfaces. Troika acids compounds can be designed to function as passivation agents on a metal surface by rendering insoluble the metal complex formed from the Troika acids compound or, alternatively, as cleaning agents by increasing the solubility of the metal complex containing residue.

Troika acid copper complexes have been shown to be readily soluble in water under basic conditions but are less soluble under acidic conditions. Accordingly, the passivating/cleaning quality effect of the Troika acid compound can be controlled by altering the pH or its molecule.

Because the chelating agents disclosed herein contain multiple ligand sites, the present invention further offers the benefit of more efficient and effective binding to metal ions found in semiconductor manufacturing processes, such as residues after plasma etching, particularly with leading edge technology where copper is used as a conducting metal.

Another advantage of the chelating agents disclosed herein is that such chelating agents could be used in dilution as a post-copper CMP clean because these groups of compounds are less acidic than organic acids and less basic than ammonia, choline hydroxide and THEMAH. In an exemplary embodiment, the compositions comprising Troika acid compound are further diluted with water prior to removing residue from a substrate, such as during integrated circuit fabrication. In a particular embodiment, the dilution factor is from about 10 to about 500.

An embodiment of the invention relates to a method for removing residue from a substrate during integrated circuit fabrication, the method including the steps of providing a substrate comprising metal and/or metal alloy portions and/or layers and a surface having organic, organometallic, and/or metal oxide etching residue thereon; and contacting the substrate with a composition comprising at least one Troika acid compound and water for a time and at a temperature sufficient to remove the residue from the substrate.

Surprisingly, it has been found that the addition of such compounds to residue removal, pre-cleaning, and resist stripping applications effectively remove contaminants while having no negative effect on the substrate surfaces.

It is to be appreciated that the disclosed specific embodiments of the present invention are only illustrative of the present invention and one of ordinary skill in the art will appreciate the ability to substitute features or to eliminate disclosed features. As such, the scope of applicant's cleaning solution and cleaning methodology are to be measured by the appended claims that follow. Thus, a novel cleaning method and solution for use in a cleaning process have been described.

While the invention has been described and illustrated herein by references to various specific materials, procedures and examples, it is understood that the invention is not restricted to the particular combinations of materials and procedures selected for that purpose. Numerous variations of such details can be implied as will be appreciated by those skilled in the art. It is intended that the specification and examples be considered as exemplary only, with the true scope and spirit of the invention being indicated by the following claims. All references, patents, and patent applications referred to in this application are herein incorporated by reference in their entirety.

What is claimed is:

1. A method of cleaning semiconductor substrates comprising the steps of:
   a. providing a semiconductor substrate having a surface comprising copper-containing conductor and a low-k dielectric material and one or more of resist, etching residue, planarization residue, and copper oxide disposed on the surface thereof;
   b. contacting the surface of the semiconductor substrate with an effective amount of an aqueous cleaning solution comprising:
      an aqueous solution of at least one or more Troika acids, its derivatives, or its salts comprising the general formula:

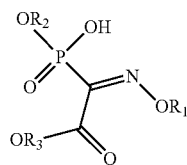

or tautomers thereof;
wherein $R_1$ is hydrogen, hydrogen, alkyl, heteroalkyl, aryl, heteroaryl; $R_2$ and $R_3$ is selected independently from the group consisting of hydrogen, alkyl, heteroalkyl, aryl, heteroaryl, sodium, and alky or aryl ammonium; wherein the semiconductor substrate is exposed to the aqueous cleaning solution at a sufficient time and temperature to effectively remove said resist, said etching and planarization residues, and said copper oxide disposed on said surface of the semiconductor substrate created during a semiconductor manufacturing process.

2. The method of claim 1, wherein, said alkyl or aryl group is selected from the group consisting of methyl, ethyl, propyl, butyl, benzyl, phenyl, p-nitrophenyl, and o-nitrobenzyl.

3. The method of claim 1, wherein said alkyl ammonium is selected from the group consisting of anilinium, dicyclohexylammonium, tetramethylammonium, benzyltetramethylammonium, 2-hydroxyethyl trimethlyammonium, and tris(2-hydroxyethyl) methylammonium.

4. The method of claim 1, wherein at least one of the Troika acids, derivatives or salts is a dendrimer comprising two or more Troika acids, derivatives, or its salts.

5. The method of claim 1, further comprising a chemical mechanical planarization step.

6. The method of claim 1, wherein the aqueous cleaning solution further comprises a compound, with an oxidation and reduction potential, in an amount of about 0.001 to about 25 percent by weight.

7. The method of claim 1, wherein the aqueous cleaning solution further comprises an additional chelating or complexing agent in an amount up to about 15 percent by weight.

8. The method of claim 1, wherein the aqueous cleaning solution comprising said at least one or more Troika acids is further diluted prior to use.

9. The method of claim 5, wherein a composition used in the chemical mechanical planarization step comprises at least one Troika acid, its derivatives, or its salts.

10. The method of claim 9 wherein the composition used in the chemical mechanical planarization step further comprises an abrasive.

* * * * *